US011621399B2

(12) United States Patent
Sano

(10) Patent No.: US 11,621,399 B2
(45) Date of Patent: Apr. 4, 2023

(54) FLEXIBLE SUBSTRATE

(71) Applicant: Japan Display Inc., Tokyo (JP)

(72) Inventor: Takumi Sano, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 120 days.

(21) Appl. No.: 17/152,796

(22) Filed: Jan. 20, 2021

(65) Prior Publication Data
US 2021/0234108 A1    Jul. 29, 2021

(30) Foreign Application Priority Data
Jan. 27, 2020  (JP) .............................. JP2020-010998

(51) Int. Cl.
*H01L 27/32*   (2006.01)
*H01L 51/00*   (2006.01)
*H01L 27/30*   (2006.01)
*H01L 51/44*   (2006.01)

(52) U.S. Cl.
CPC ........ *H01L 51/0097* (2013.01); *H01L 27/301* (2013.01); *H01L 27/305* (2013.01); *H01L 51/442* (2013.01)

(58) Field of Classification Search
CPC . H01L 27/0288; H01L 21/82; H01L 27/0218; H01L 51/0097; H01L 27/301; H01L 27/305; H01L 51/442; H01L 27/3276; Y02E 10/549
See application file for complete search history.

(56) References Cited

U.S. PATENT DOCUMENTS

2017/0170238 A1    6/2017   Lee et al.
2018/0114825 A1*   4/2018   Hong .................... H01L 27/322

FOREIGN PATENT DOCUMENTS

| JP | 2017-112376 A | 6/2017 |
| JP | 2019-160826 A | 9/2019 |

* cited by examiner

*Primary Examiner* — Samuel Park
(74) *Attorney, Agent, or Firm* — Xsensus LLP

(57) ABSTRACT

According to one embodiment, a flexible substrate includes an insulating basement including an island-like portion and a plurality of belt portions, an organic insulating layer, and an electrical element and a projecting portion provided on the organic insulating layer and overlapping the island-like portion. The electrical element includes a common electrode, a first electrode located between the organic insulating layer and the common electrode, and an active layer located between the common electrode and the first electrode. The projecting portion is located on the first electrode and projects in a direction towards the common electrode from the first electrode.

12 Claims, 17 Drawing Sheets

F.I.G. 6

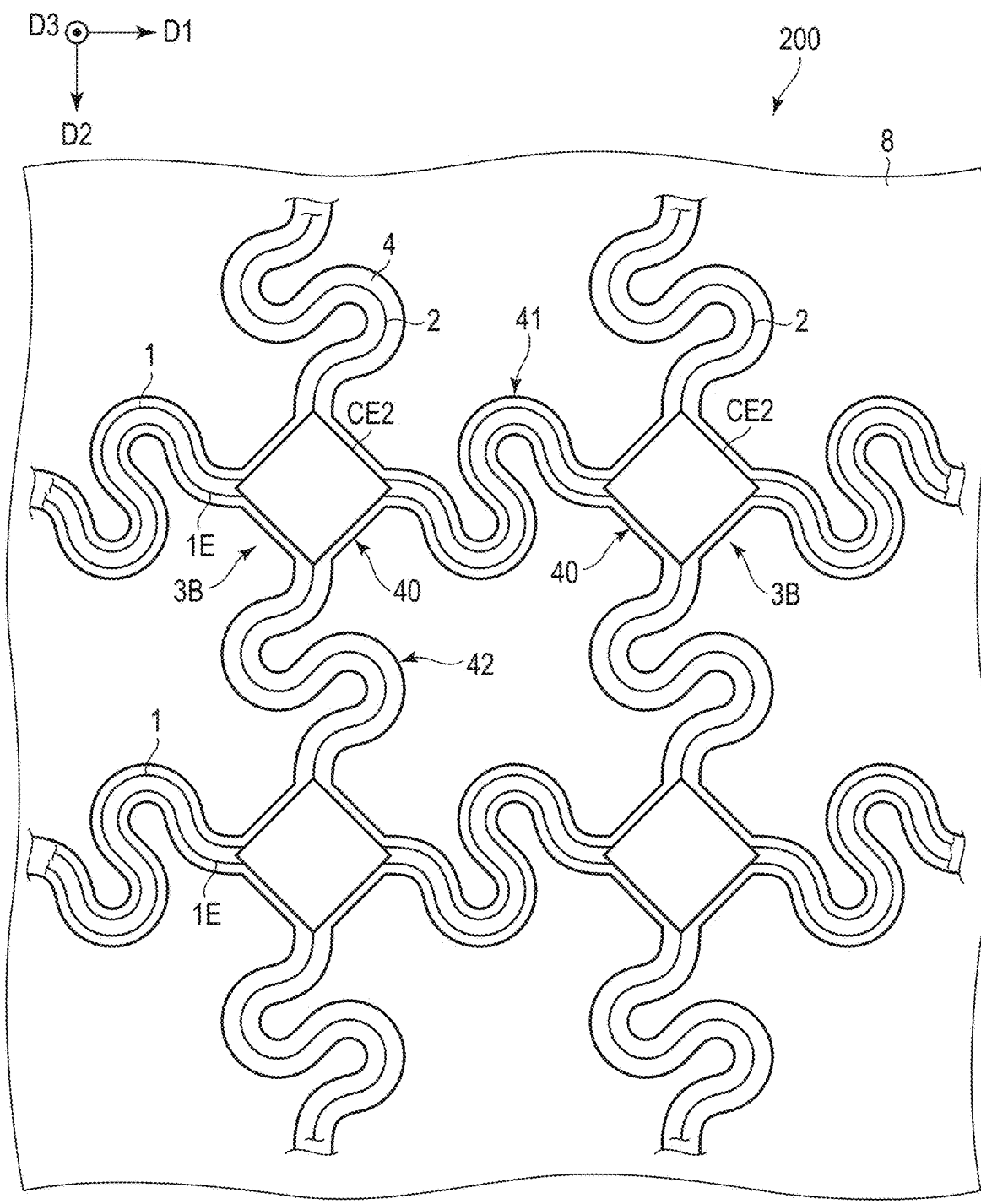
F I G. 12

FLEXIBLE SUBSTRATE

CROSS-REFERENCE TO RELATED APPLICATIONS

This application is based upon and claims the benefit of priority from Japanese Patent Application No. 2020-010998, filed Jan. 27, 2020, the entire contents of which are incorporated herein by reference.

FIELD

Embodiments described herein relate generally to a flexible substrate.

BACKGROUND

Recently, the use of flexible and elastic substrates is studied in various kinds of fields. For example, such a use mode is considered, that a flexible substrate on which electrical elements are arranged in a matrix is attached on a curve surface such as of a case of an electronic equipment or the human body or the like. As the electrical elements, for example, various types of sensors such as touch sensors and temperature sensors and display elements are applicable.

For the flexible substrates, it is necessary to take measures to prevent wiring from being damaged by stress due to inflection, expansion and contraction. Examples of such measures conventionally proposed are forming honeycomb-shaped openings in a basement which support the wiring, and forming the wiring into a meandered fashion (a meander shape).

BRIEF DESCRIPTION OF THE DRAWINGS

FIG. 12 is an enlarged plan view showing a flexible substrate of the second embodiment.

DETAILED DESCRIPTION

In general, according to one embodiment, there is provided a flexible substrate comprising an insulating basement including an island-like portion and a plurality of belt portions formed to be integrated with the island-like portion, an organic insulating layer provided on the insulating basement and an electrical element and a projecting portion provided on the organic insulating layer and overlapping the island-like portion. The electrical element comprises a common electrode, a first electrode located between the organic insulating layer and the common electrode, and an active layer located between the common electrode and the first electrode. The projecting portion is located on the first electrode and projecting in a direction towards the common electrode from the first electrode.

Embodiments will be described hereinafter with reference to the accompanying drawings. The disclosure is a mere example, and arbitrary change of gist which can be easily conceived by a person of ordinary skill in the art naturally falls within the inventive scope. To more clarify the explanations, the drawings may pictorially show width, thickness, shape and the like, of each portion as compared with an actual aspect, but they are mere examples and do not restrict the interpretation of the invention. In the present specification and drawings, elements like or similar to those in the already described drawings may be denoted by similar reference numbers and their detailed descriptions may be arbitrarily omitted.

Figure 1:
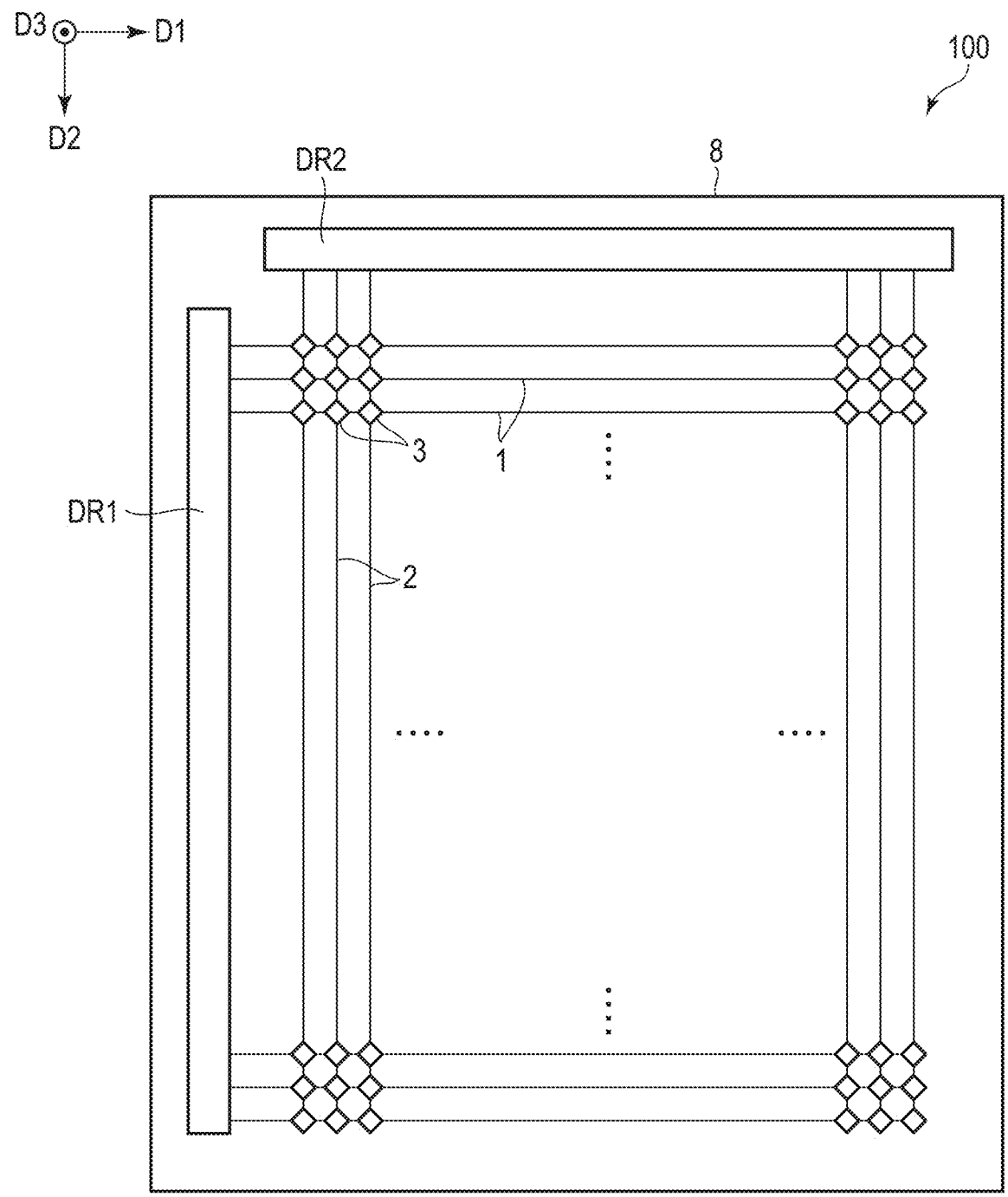
FIG. 1 is a schematic plan view of a flexible substrate of the first embodiment.

FIG. 1 is schematic plan view of a flexible substrate 100 according to an embodiment. In this embodiment, a direction D1, a direction D2 and a direction D3 are defined as illustrated in the drawing. The direction D1 and the direction D2 are parallel to a main surface of the flexible substrate 100 and they intersect each other. The direction D1 and the direction D2 intersect perpendicular to each other in this embodiment, but they may intersect at an angle other than the perpendicular. The direction D3 is perpendicular to the direction D1 and the direction D2, and is equivalent to a thickness direction of the flexible substrate 100. In this specification, a position on a distal end side indicated by an arrow indicating the direction D3 is referred to as an upper portion (or merely, top) and a position on a rear end side of the arrow is referred to as a lower portion (or merely, bottom).

As shown in FIG. 1, the flexible substrate 100 comprises a plurality of scanning lines 1, a plurality of signal lines 2, a plurality of electrical elements 3, a supporter 8, a scanning line driver DR1 and a signal line driver DR2. Note that the scanning line driver DR1 and the signal line driver DR2 may be provided outside the flexible substrate 100. The scanning lines 1, the signal lines 2 and the electrical elements 3 are provided on the supporter 8.

The scanning lines 1 each extend in the direction D1, and are arranged in the direction D2. The scanning lines 1 are each electrically connected to the scanning line driver DR1. The signal lines 2 each extend in the direction D2, and are arranged in the direction D1. The signal lines 2 are each electrically connected to the signal line driver DR2. Each of the electrical elements 3 is provided in an intersection between a scanning line 1 and a signal line 2, and electrically connected to the scanning line 1 and the signal line 2.

The scanning lines 1 and the signal lines 2 are an example of a wiring layer of the flexible substrate 100. The scanning lines 1 and the signal lines 2 can be formed from, for example, a metallic material or a transparent conductive material, and they may be of a single- or multi-layered structure. The flexible substrate 100 may comprise, in addition to the scanning lines 1 and the signal lines 2, other type of wiring lines such including a power line to supply power to a respective electrical element 3.

The scanning lines 1 supply scanning signals to the electrical elements 3. For example, when the electrical elements 3 are accompanied by the output of the signal such as the sensor, an output signal from an electrical element 3 is supplied to the signal line 2.

In an example illustrated in FIG. 1, the scanning line driver DR1 function as a source of supplying a scanning signal to each of the scanning lines 1. Further, the signal line driver DR2 functions as a source of supplying a driving signal to each of the signal lines 2 or a signal processing unit which processes an output signal output to each of the signal lines 2.

Figure 2:
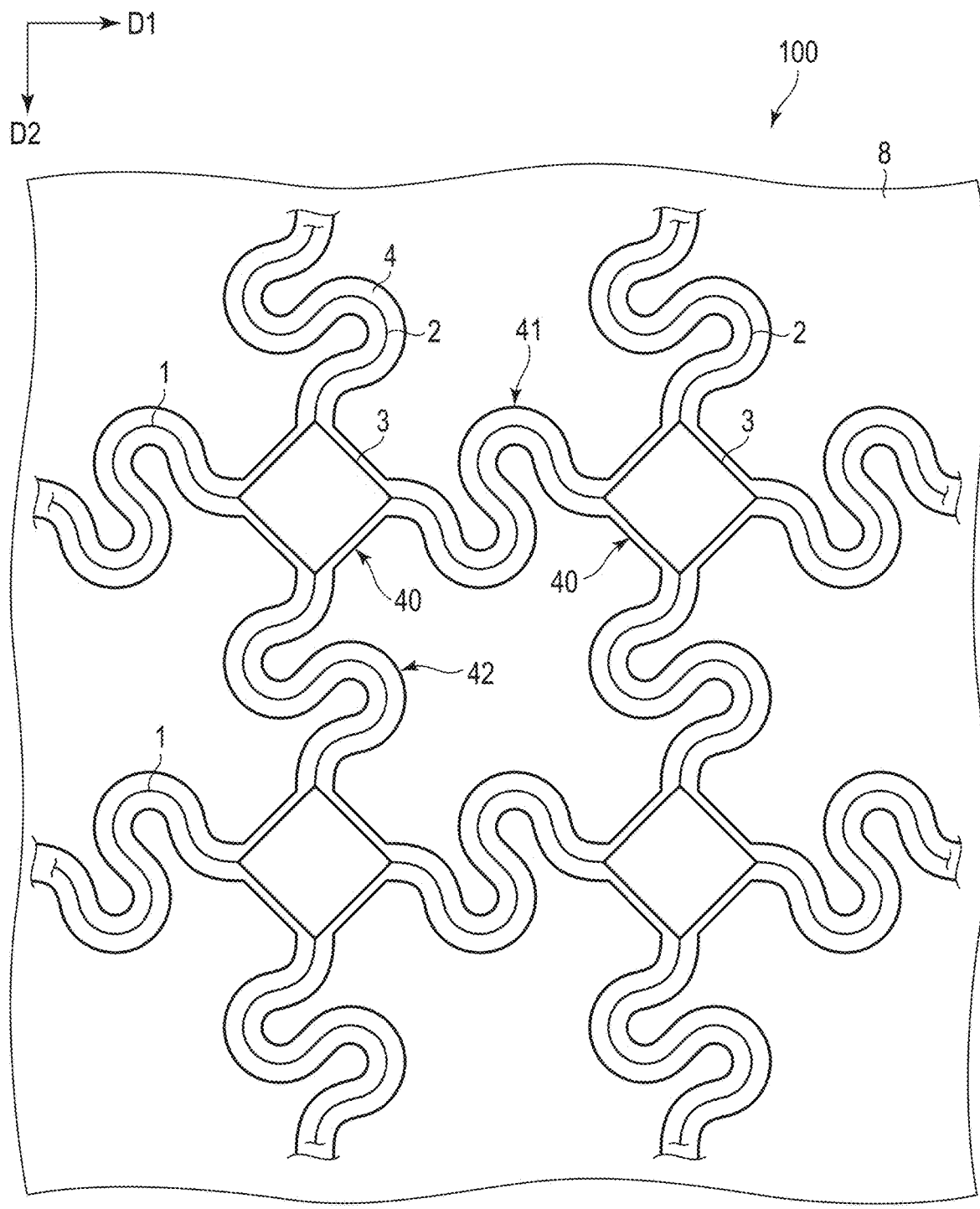
FIG. 2 is a partially enlarged plan view of the flexible substrate shown in FIG. 1.

FIG. 2 is a partial enlarged plan view of the flexible substrate 100 shown in FIG. 1.

As shown in FIG. 2, the flexible substrate 100 comprises an insulating basement 4 which supports the scanning line 1 and the signal lines 2, in addition to those described above. The insulating basement 4 is elastic and flexible. The insulating basement 4 can be formed of, for example, polyimide, but it is not limited to this.

The insulating basement 4 comprises a plurality of island-like portions 40, belt portions 41 and belt portions 42 which are formed integrally with the island-like portions 40, respectively, into a mesh manner. The island-like portions 40 are arranged in the direction D1 and the direction D2 with intervals therebetween. Each belt portion 41 connects a plurality of island-like portions 40 arranged in the direction D1. Each belt portion 42 connects a plurality of island-like portions 40 arranged in the direction D2. The belt portions 41 are formed expandable/contractible in the direction D1 and overlap the scanning lines 1, respectively. The belt portions 42 are formed expandable/contractible in the direction D2 and overlap the signal lines 2, respectively. The belt portions 41 and the belt portions 42 are formed into a wavy shape in plan view, and each comprise at least one curved portion. In other words, the belt portions 41 and the belt portions 42 are formed into a meander shape in plan view. In the example illustrated, the belt portions 41 and the belt portions 42 each comprise a linear portion which connects the island-like portion 40 and the respective curved portion to each other.

Each of the island-like portions 40 is formed into, for example, a quadrangular shape in plan view. Note that the island-like portions 40 may be formed into some other polygonal shape, or a circular or elliptical shape. Each electrical element 3 overlaps the respective island-like portion 40.

The scanning lines 1 and the signal lines 2 are equivalent to a wiring layer provided on the insulating basement 4. The scanning lines 1 and the signal lines 2 are provided in the same layer, which will be described later. Each scanning line 1 and the respective signal line 2 intersect each other on the respective island-like portion 40. Each scanning line 1 is provided over the respective belt portion 41 and formed into a shape similar to that of the belt portion 41. Each signal line 2 is provided over the respective belt portion 42 and formed in a shape similar to that of the belt portion 42. That is, the scanning lines 1 and the signal lines 2 are all formed into a meander shape.

Figure 3:
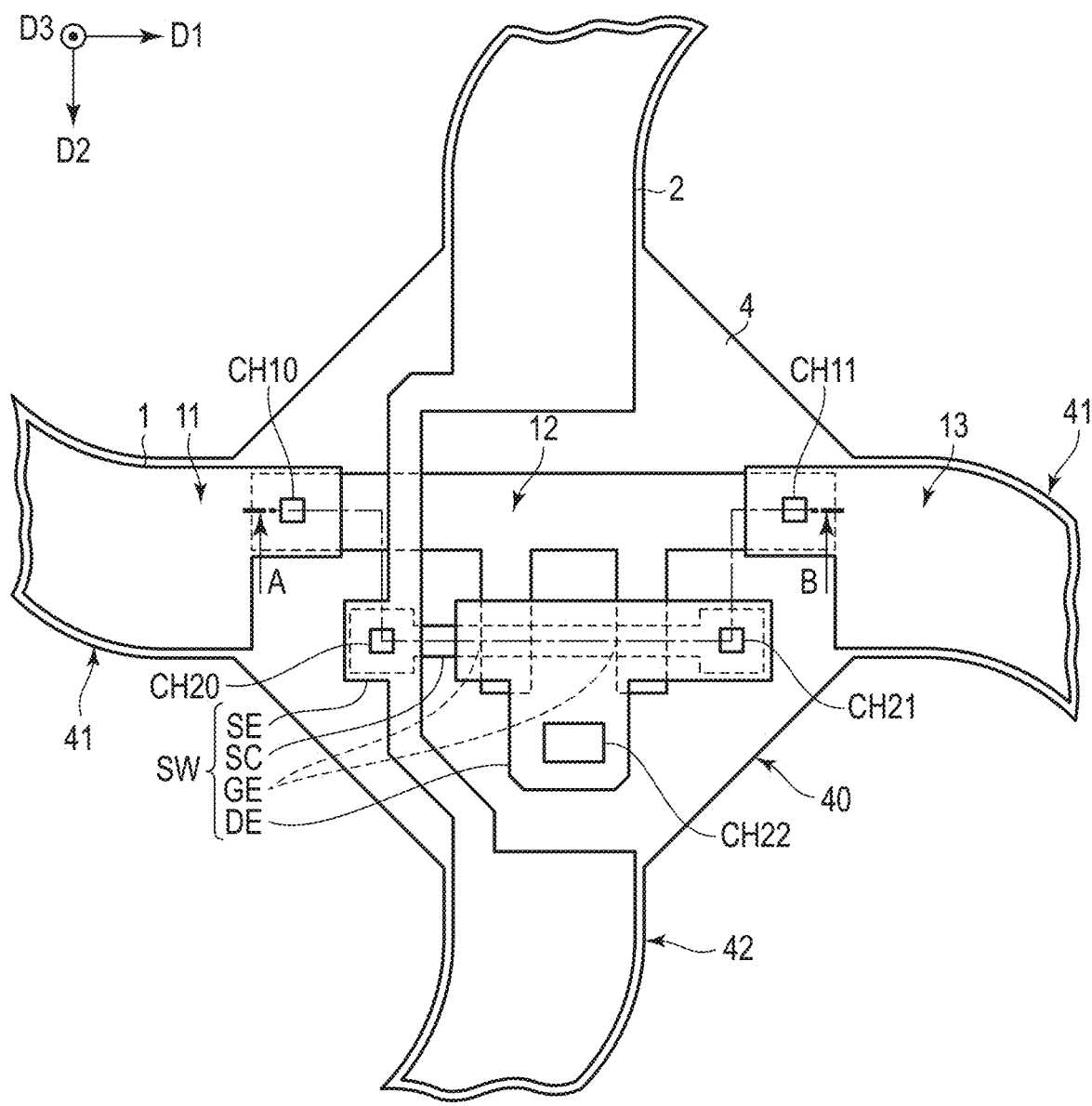
FIG. 3 is an enlarged plan of an island-like portion shown in FIG. 2.

FIG. 3 is an enlarged plan view of an island-like portion 40 shown in FIG. 2. In FIG. 3, the electrical element 3 is omitted from the illustration.

As shown in FIG. 3, each scanning line 1 includes a portion 11, a portion 12 and a portion 13. The portion 11 and the portion 13 are formed in the same layer as that of the signal lines 2 and they extend along the belt portion 41. The portion 12 is formed in a layer different from that of the signal line 2 and intersects the signal line 2. The portion 11 and the portion 12 are connected to each other through a contact hole CH10 and the portion 12 and the portion 13 are connected to each other through a contact hole CH11.

A switching element SW comprises a semiconductor layer SC, a gate electrode GE, a source electrode SE and a drain electrode DE. The gate electrode GE is formed to be integrated with the portion 12 of the respective scanning line 1. The source electrode SE is formed to be integrated with the respective signal line 2. One end of the semiconductor layer SC is connected to the source electrode SE through a contact hole CH20, and the other end of the semiconductor layer SC is connected to the drain electrode DE through a contact hole CH21. The drain electrode DE is connected to the first electrode, which will be described later, through a contact hole CH22.

Figure 4:
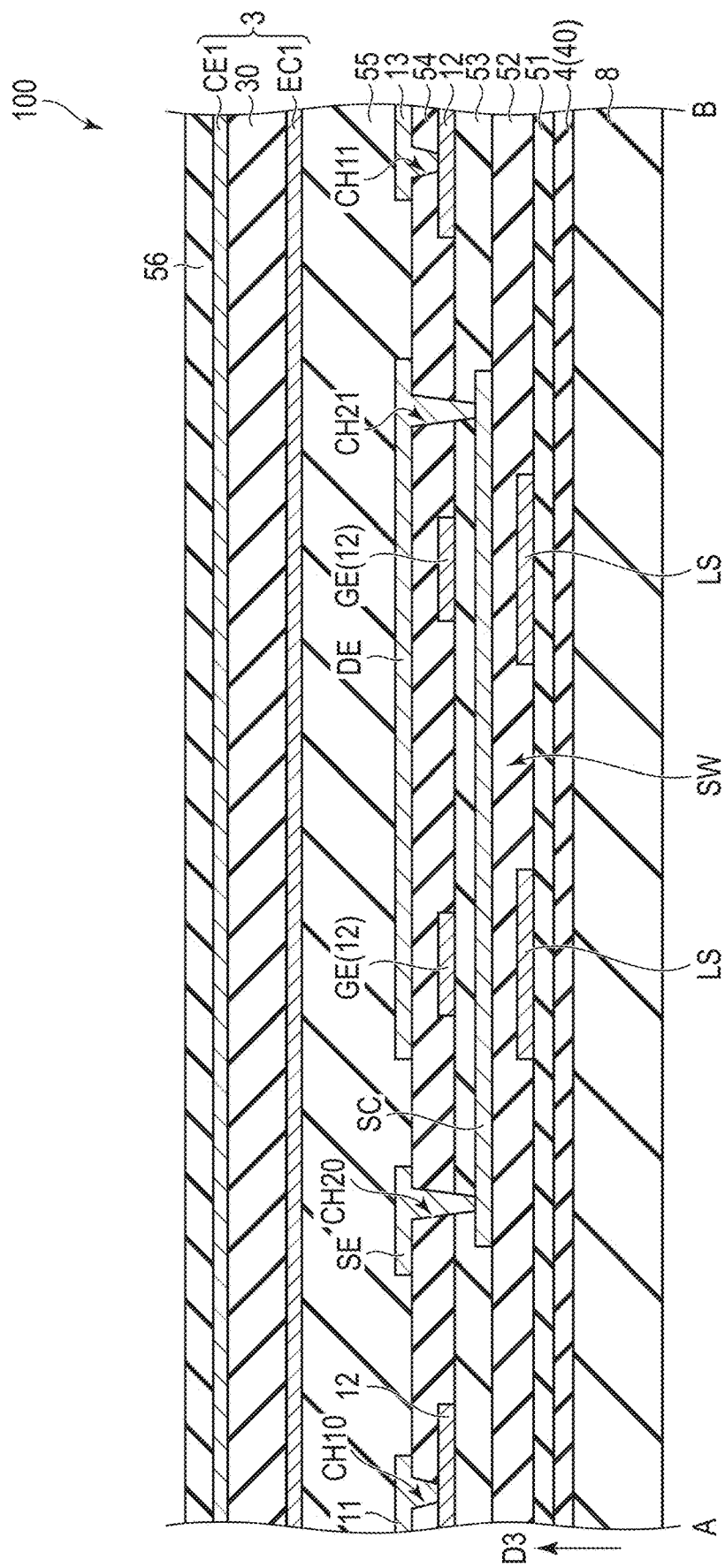
FIG. 4 is a cross-sectional view of the flexible substrate along line A-B in FIG. 3.

FIG. 4 is a cross-sectional view of the flexible substrate 100, taken along line A-B shown in FIG. 3.

As shown in FIG. 4, the flexible substrate 100 further comprises an insulating layer 51, an insulating layer 52, an insulating layer 53, an insulating layer 54, an insulating layer 55, a sealing layer 56 and a light-shielding layer LS.

The insulating layer 51 covers the island-like portion 40 of the insulating basement 4. The light-shielding layer LS is located on the insulating layer 51 and is covered by the insulating layer 52. In the example illustrated, the light-shielding layer LS overlap the gate electrode GE. With this structure, the light-shielding layer LS can shield the light from a lower side (a supporter 8 side) toward the gate electrode GE. The light-shielding layer LS is formed of, for example, a metallic material such as aluminum (Al), titanium (Ti), silver (Ag), molybdenum (Mo), tungsten (W), copper (Cu), chromium (Cr) or the like.

The semiconductor layer SC is located on the insulating layer 52 and is covered by the insulating layer 53. The semiconductor layer SC is formed of, for example, polycrystalline silicon (for example, low-temperature polysilicon), but it may be formed of amorphous silicon or an oxide semiconductor.

The portion 12 is located on the insulating layer 53, and is covered by the insulating layer 54. The portion 12 is connected to the portion 11 through the contact hole CH10 which penetrates the insulating layer 54. The portion 12 is connected to the portion 13 through the contact hole CH11 which penetrates the insulating layer 54. The gate electrode GE overlaps the light-shielding layer LS. The portion 12 is formed of the metallic material listed above, or an alloy of any combination of these, and may be of a single- or multi-layered structure.

The portion 11, the portion 13, the source electrode SE and the drain electrode DE are each located on the insulating layer 54 and they are covered by the insulating layer 55. The portion 11 and the portion 13 are formed of the metallic material listed above, or an alloy of any combination of these, and may be of a single- or multi-layered structure.

For example, the portions 11 and 13 are each a stacked layer in which titanium (Ti), aluminum (Al) and titanium (Ti) are stacked one on another. The source electrode SE is connected to the semiconductor layer SC through the contact hole CH20 which penetrates the insulating layers 53 and 54. The drain electrode DE is connected to the semiconductor layer SC through the contact hole CH21 which penetrates the insulating layers 53 and 54. In the example illustrated, the drain electrode DE covers the gate electrode GE. With this structure, the drain electrode DE can shield the light from an upper part (a first electrode EC1 side) toward the gate electrode GE.

The insulating layers 51 to 54 are all inorganic insulating layers formed of an inorganic insulating material such as silicon oxide (SiO), silicon nitride (SiN), silicon oxynitride (SiON) or the like. The insulating layer 55 is an organic insulating layer formed of an organic material such as acryl resin or the like. An upper surface of the insulating layer 55 is substantially planarized. The insulating layer 55 is provided on the insulating basement 4 (the island-like portion 40, the belt portion 41 and the belt portion 42).

The switching element SW is formed between the insulating basement 4 and the insulating layer 55. The switching element SW illustrated here is of a double-gate structure, but it may be of a single-gate structure. Further, the switching element SW is of a top-gate structure in which the gate electrode GE is arranged above the semiconductor layer SC, but it may of a bottom-gate structure in which the gate electrode GE is arranged below the semiconductor layer SC.

The electrical element 3 is provided on the insulating layer 55 and is covered by the sealing layer 56. The electrical element 3 is, for example, an organic photodetector (OPD). Note that the electrical element 3 may be an organic photovoltaics (OPV). The electrical element 3 comprises a first electrode EC1, an active layer 30 and a common electrode CE1. The first electrode EC1 is located on the insulating layer 55 and is covered by the active layer 30. The first electrode EC1 is located between the insulating layer 55 and the common electrode CE1. The first electrode EC1 is a transparent electrode formed of a transparent conductive material such as indium tin oxide (ITO), indium zinc oxide (IZO) or the like. The active layer 30 is located on the first electrode EC1 and is covered by the common electrode CE1. The active layer 30 is located between the first electrode EC1 and the common electrode CE1. The active layer 30 is formed of an electron donor (p-type semiconductor) and an electronic receptor (n-type semiconductor), each formed of an organic material. The common electrode CE1 is located on the active layer 30 and is covered by the sealing layer 56. The common electrode CE1 is a transparent electrode formed of a transparent conductive material such as ITO or IZO. Although not illustrated in the drawing, an electron-transport layer is formed between the first electrode EC1 and the active layer 30, and a hole-transport layer is formed between the common electrode CE and the active layer 30.

Figure 5:
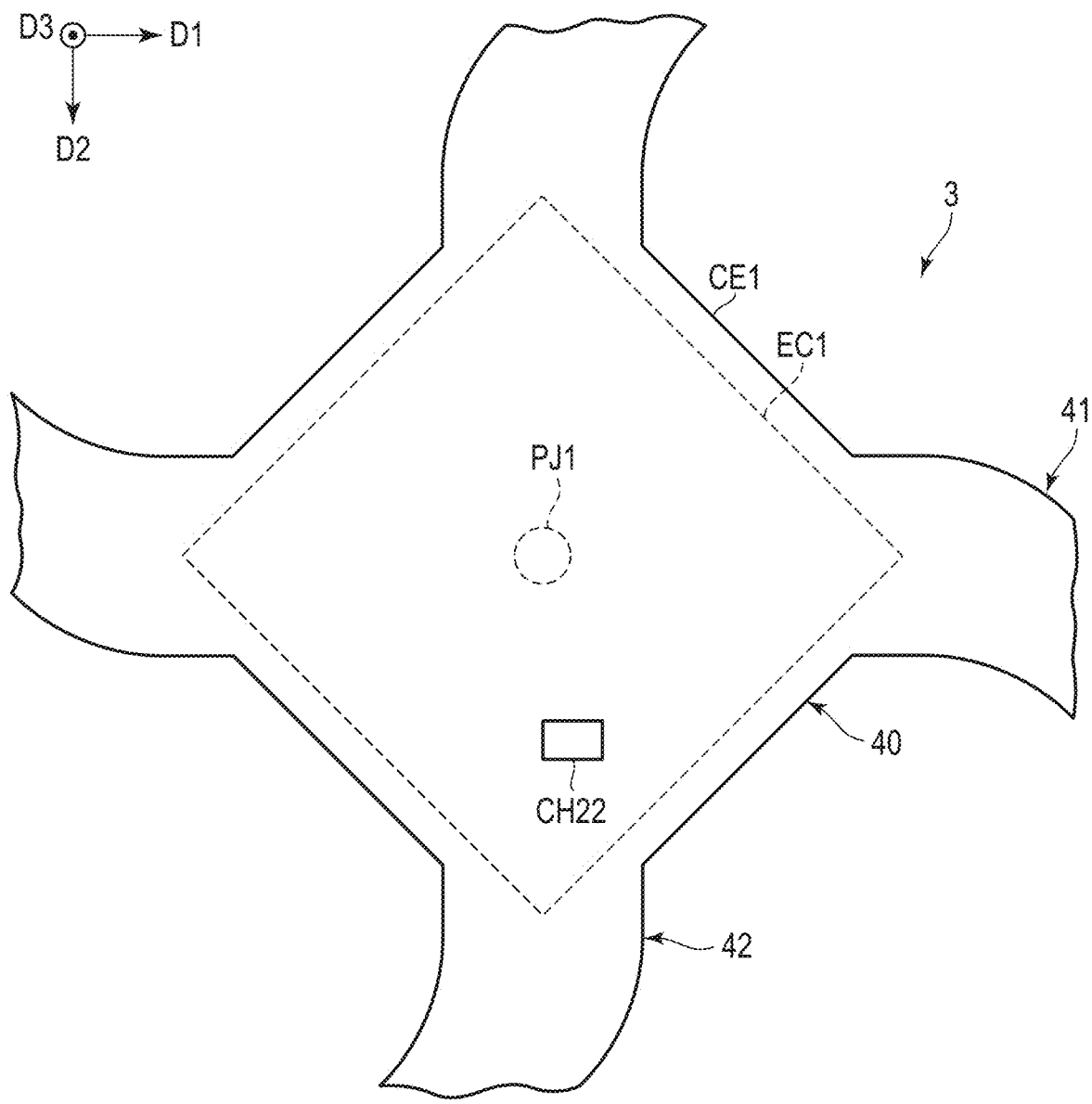
FIG. 5 is a plan view of an electrical element and the island-like portion shown in FIG. 4.

FIG. 5 is a plan view of the electrical element 3 and the island-like portion 40 shown in FIG. 4.

As shown in FIG. 5, the flexible substrate 100 further comprises a projecting portion PJ1. The projecting portion PJ1 overlaps the island-like portion 40 and is placed in a center of the first electrode EC1. In the example illustrated, there is one projecting portion PJ1, but a plurality of projecting portions may be provided, or these protrusions need not be placed in the center of the first electrode EC1.

The first electrode EC1 is formed on the island-like portion 40. The first electrode EC1 is connected to the drain electrode DE (see FIG. 4) through the contact hole CH22. The common electrode CE1 is formed into a shape similar to that of the insulating basement 4, that is, for example, a mesh shape. To the common electrode CE1, for example, a common potential is supplied. Although not shown, the active layer 30 as well is also formed into a shape similar to that of the common electrode CE1.

Figure 6:
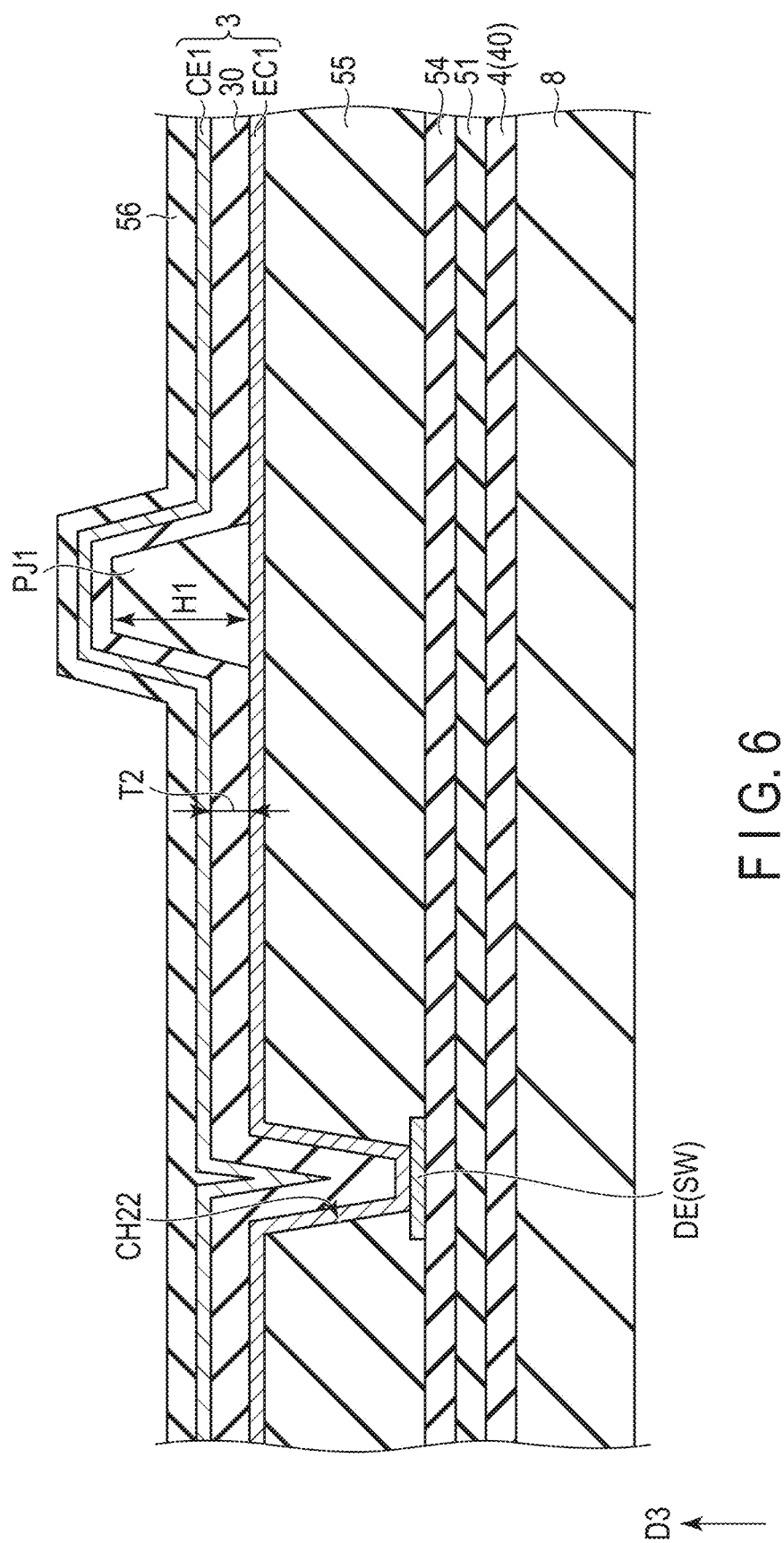
FIG. 6 is a cross-sectional view including the electrical element and a projecting portion shown in FIG. 5.

FIG. 6 is cross-sectional view which includes the electrical element 3 and the projecting portion PJ1 shown in FIG. 5. Here, the layers located between the insulating layer 51 and the insulating layer 54 are omitted from the illustration.

As shown in FIG. 6, the first electrode EC1 is connected to the drain electrode DE through the contact hole CH22 which penetrates the insulating layer 55. The projecting portion PJ1 is located above the first electrode EC1 and the insulating layer 55, and is covered by the active layer 30. In the example illustrated, the projecting portion PJ1 is also covered by each of the common electrode CE1 and the sealing layer 56. Note that projecting portion PJ1 may be formed to be integrated with the insulating layer 55 as one body. The projecting portion PJ1 projects in the direction D3 (the direction facing from the first electrode EC1 to the common electrode CE1). The projecting portion PJ1 has a thickness H1. The active layer 30 has a thickness T2. The thickness H1 and the thickness T2 are each a length in the direction D3. The thickness T2 is less than the thickness H1. The thickness H1 is, for example, 1,000 nm and the thickness T2 is, for example, 500 nm.

Figure 7:
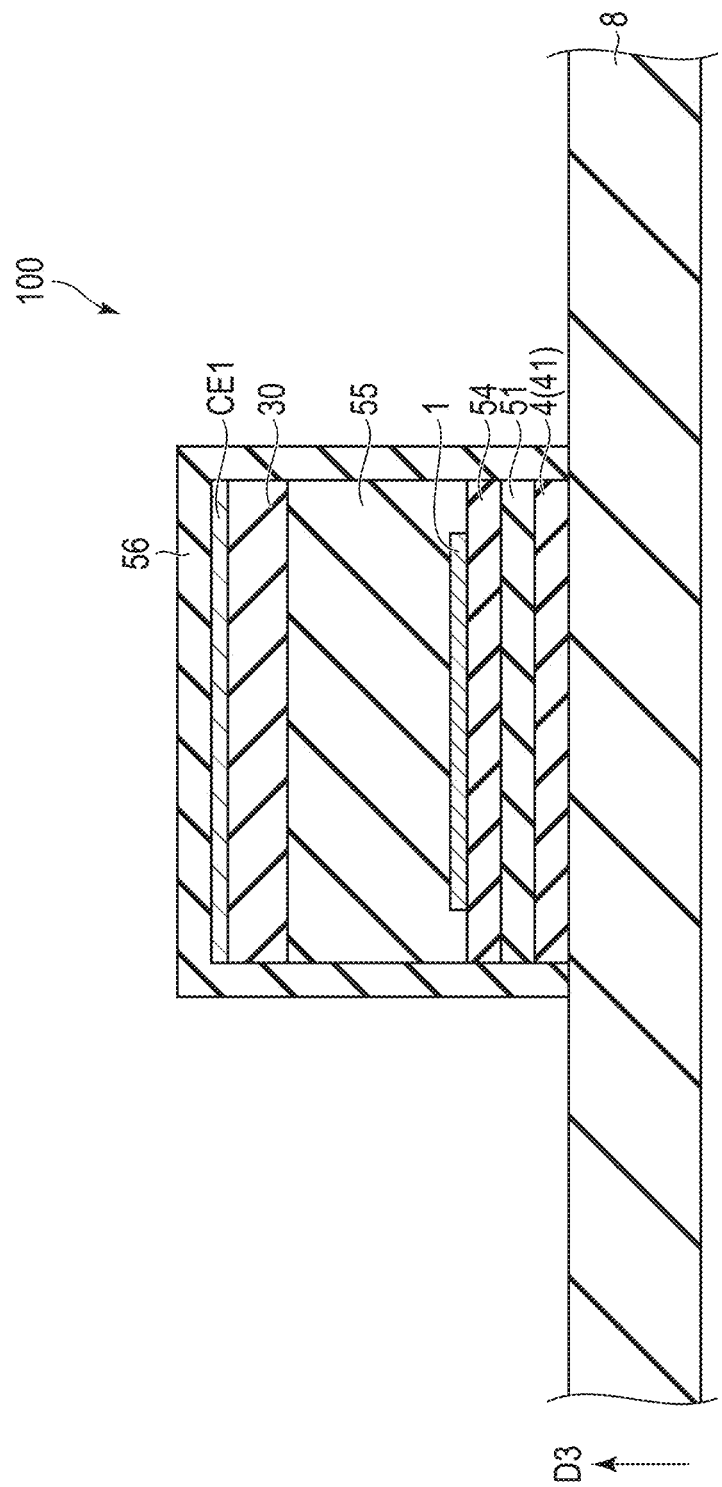
FIG. 7 is a cross-sectional view of the flexible substrate in a belt portion shown in FIG. 5.

FIG. 7 is a cross-sectional view of the flexible substrate 100 in the belt portion 41 shown in FIG. 5. Here, the layers located between the insulating layer 51 and the insulating layer 54 are omitted from the illustration.

As shown in FIG. 7, the scanning line 1 is located on the insulating layer 54, and is covered by the insulating layer 55. Above the belt portion 41, the first electrode EC1 is not provided between the insulating layer 55 and the active layer 30. The sealing layer 56 covers the common electrode CE1, the active layer 30, the insulating layer 55 and the belt portion 41, and it is in contact with the supporter 8. The insulating layers located between the common electrode CE1 and the supporter 8 each have a shape similar to that of the common electrode CE1. Note that in the belt portion 42, the flexible substrate 100 also has a structure similar to that shown in FIG. 7.

Figure 8:
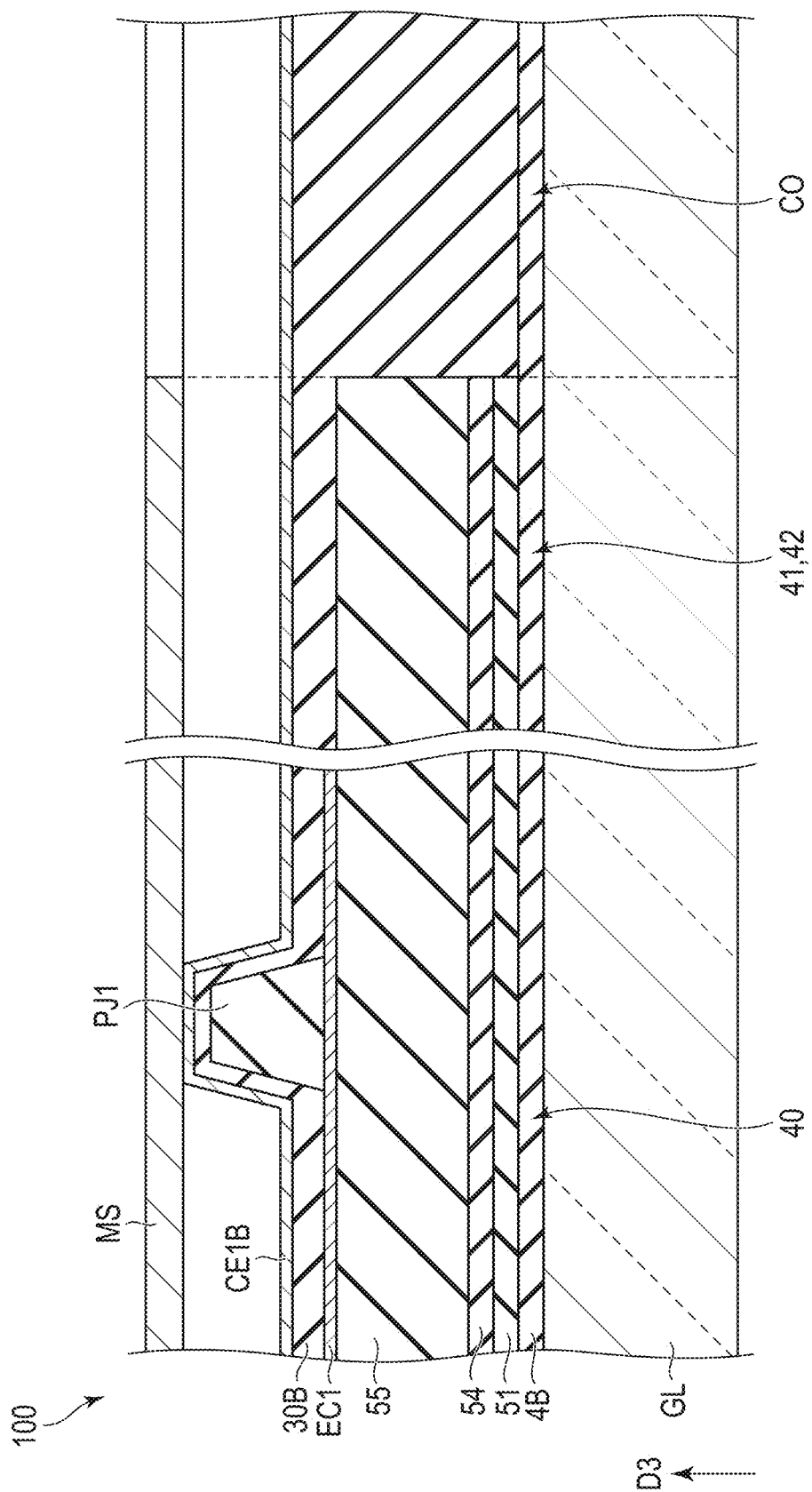
FIG. 8 is a cross-sectional view illustrating a processing step of manufacturing the flexible substrate.
Figure 9:
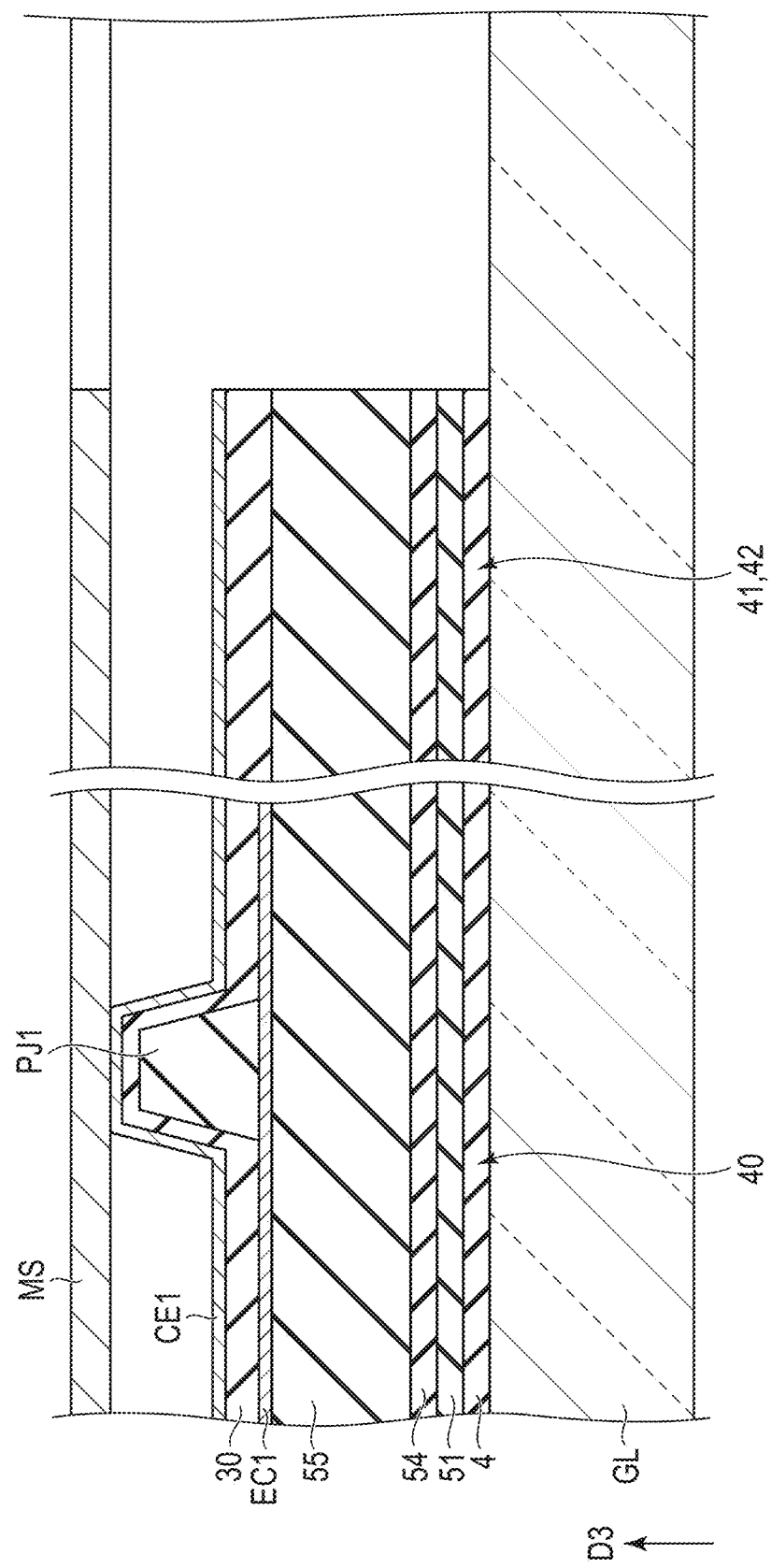
FIG. 9 is a cross-sectional view illustrating a processing step which follows that of FIG. 8.
Figure 10:
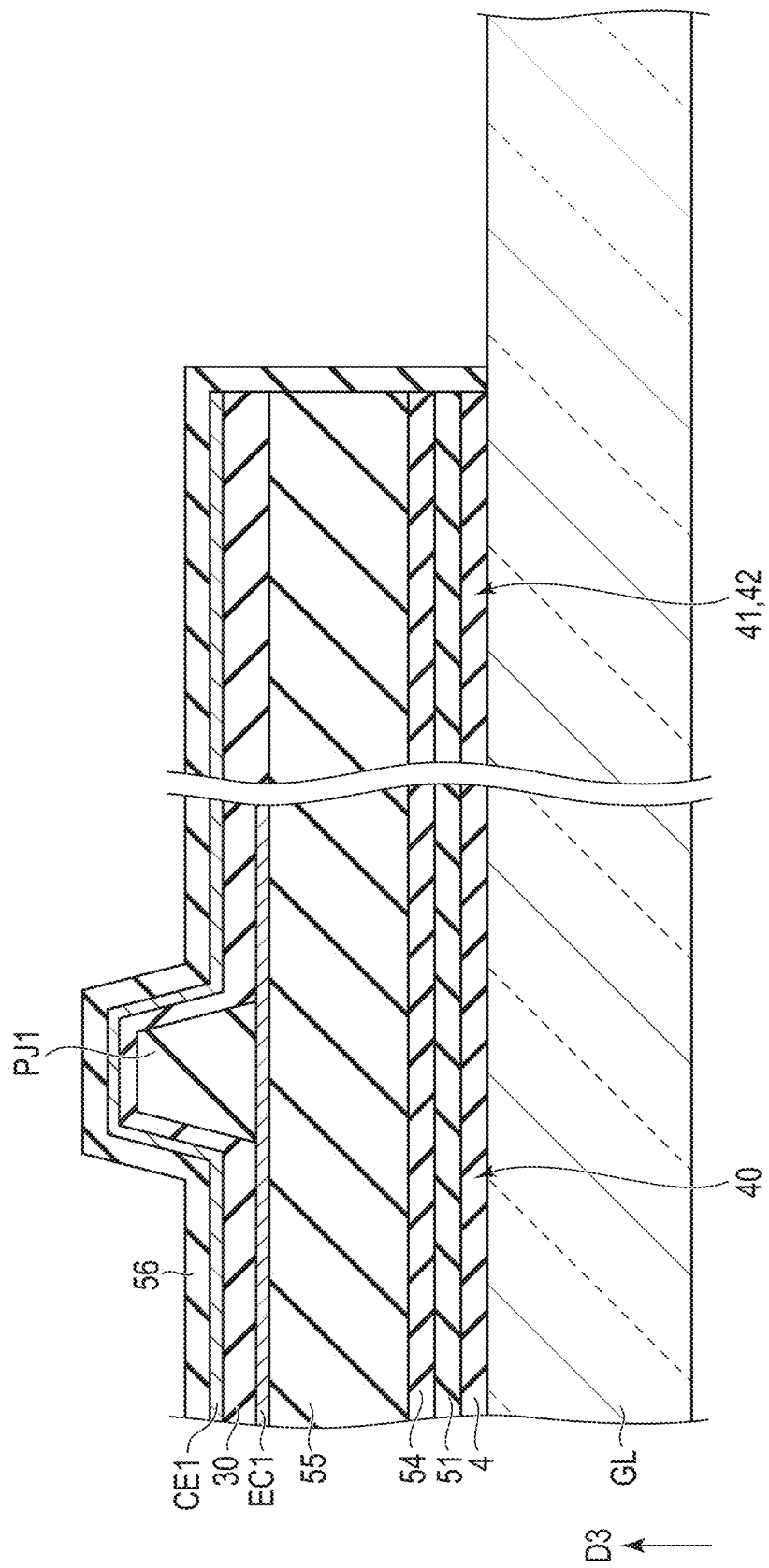
FIG. 10 is a cross-sectional view illustrating a processing step which follows that of FIG. 9.

FIGS. 8 to 10 are cross-sectional views showing an example of a method of manufacturing the flexible substrate 100 in the order.

In FIG. 8, an insulating basement 4B is formed on a glass substrate GL. The glass substrate GL has a shape similar to that of the supporter 8 shown in FIG. 1. The insulating basement 4B comprises an island-like portion 40, a belt portion 41, a belt portion 42 and a cut portion CO. The cut portion CO is a portion removed by, for example, dry etching or laser ablation. An active layer 30B is formed by coating by, for example, ink jet printing or the like. The active layer 30B and the common electrode CE1B are provided over above each of the island-like portion 40, the belt portion 41, the belt portion 42 and the cut portion CO. The common electrode CE1B covers the active layer 30B. In the example illustrated, a metal mask MS is placed on a portion protruding due to the projecting portion PJ1. The metal mask MS is formed of, for example, stainless steel and it has a shape similar to that of the insulating basement 4 shown in FIG. 2.

In FIG. 9, using the metal mask MS as a mask, the cut portion CO, the active layer 30B provided on the cut portion CO and the common electrode CE1B provided above the cut portion CO are patterned in one operation by, for example, dry etching or laser ablation. Thus, the insulating basement 4B is transformed into the insulating basement 4, the active layer 30B is transformed into the active layer 30 and the common electrode CE1B is transformed into the common electrode CE1.

In FIG. 10, after removing the metal mask MS, the sealing layer 56 is formed. In the example illustrated, the sealing layer 56 covers an end portion of each of the active layer 30 and the insulating layer 55, which is exposed by the patterning. Laser is applied from below the glass substrate GL so as to release the glass substrate GL from the insulating basement 4. Then, the insulating basement 4 is attached to the supporter 8, and thus the flexible substrate 100 is obtained.

According to the first embodiment, the projecting portion PJ1 is provided on the first electrode EC1. Thus, the active layer 30 and the common electrode CE1 can be patterned in one operation. There are some organic materials to be used for the active layer 30, which are susceptible to heat or a developer to remove resists, and cannot be patterned by photolithography. Even such an organic material can be used for the active layer 30, and therefore in the selection of the material for the active layer 30, the choice of options is widened.

Further, the thickness H1 of the projecting portion PJ1 is greater than the thickness T2 of the active layer 30. With this structure, a gap can be formed between the end portion of the active layer 30, exposed by the patterning and the metal mask MS as compared to the case where the projecting portion PJ1 is not provided on the first electrode EC1 in the one-operation patterning of the active layer 30 and the common electrode CE1 using the metal mask. Thus, the degradation of the active layer 30, which may be caused by being brought into contact with the metal mask MS, can be inhibited, and therefore, a flexible substrate with an improved product reliability can be provided.

Figure 11:
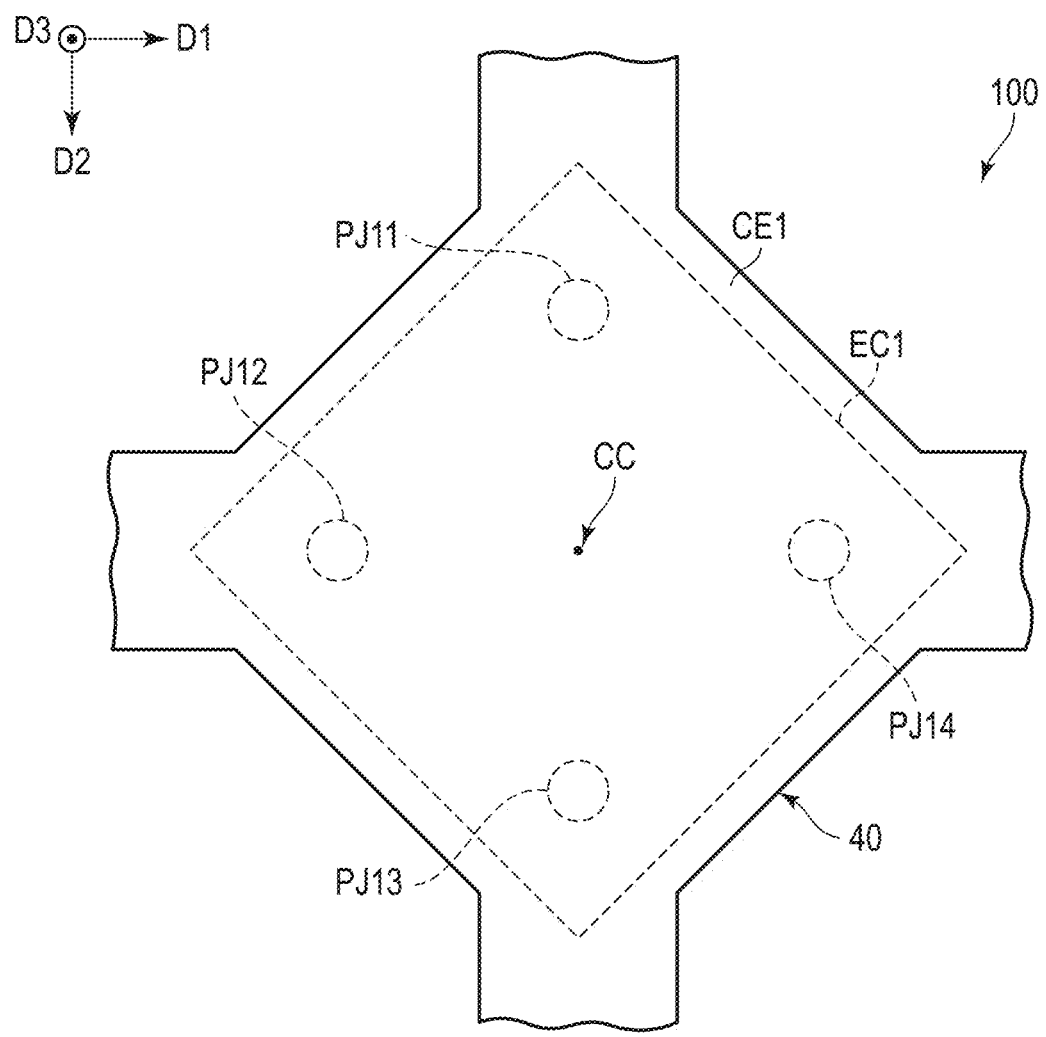
FIG. 11 is a plan view of a modified example of the flexible substrate of the first embodiment.

FIG. 11 is a plan view showing a modified example of the flexible substrate 100 of the first embodiment.

As shown in FIG. 11, the modified example of the first embodiment is different from the first embodiment shown in FIG. 5 in that the flexible substrate 100 comprises a plurality of projecting portions. A projecting portion PJ11, a projecting portion PJ12, a projecting portion PJ13 and a projecting portion PJ14 are located above an island-like portion 40 and are provided on the first electrode EC1 as in the case of the projecting portion PJ1 (see FIG. 6). The projecting portions PJ11 to PJ14 overlap the first electrode EC1 in plan view. In the example illustrated, the projecting portions PJ11 to PJ14 are arranged to be vertically and horizontally symmetrical with respect to a center CC of the first electrode EC1.

In the modified example configured as described above, an advantageous effect similar to that of the first embodiment can be also obtained. In addition, a plurality of projecting portions are provided on one first electrode EC1. With this structure, even if a force is applied to the flexible substrate 100 from outside, the force is dispersed on these projecting portions. Therefore, the force is not concentrated on one point of the first electrode EC1, thereby making it possible to inhibit damage on the first electrode EC1. Further, the projecting portions are arranged to be vertically and horizontally symmetrical with respect to the center CC of the first electrode EC1 in plan view. With this structure, even if a force is applied to the flexible substrate 100 from outside, the force is dispersed applied equally on these projecting portion. Therefore, it is possible to inhibit specific torsion or bending stress from occurring in the first electrode EC1, and therefore the first electrode EC1 can be inhibited from being damaged.

FIG. 12 is an enlarged plan view of a flexible substrate 200 of the second embodiment.

As shown in FIG. 12, the second embodiment is different from the first embodiment shown in FIG. 1 in that the flexible substrate 200 comprises power lines 1E and a common electrode CE2 is provided individually for each of a plurality of island-like portions 40. The flexible substrate 200 comprises a plurality of scanning lines 1, a plurality of power lines 1E, a plurality of electrical elements 3B and an insulating basement 4. The power lines 1E each extend in the direction D1, and they are arranged in the direction D2. Each power line 1E is provided over the respective belt portion 41 and is formed into a shape similar to that of the belt portion 41. Each power line 1E is formed into a meander shape in plan view. Each scanning line 1 and the respective power line 1E are electrically separated from each other. The layer scanning lines 1 and the power lines 1E are provided in the same layer, which will be described later. Each power line 1E is connected to a feeding pad to feed power, which is, for example, a common potential.

Each electrical element 3B comprises a common electrode CE2. The common electrodes CE2 are arranged at intervals respectively therebetween and are not formed as a successive integral body. More specifically, the common electrode CE2 is provided on only the island-like portion 40, and not provided on the belt portion 41 or the belt portion 42.

Figure 13:
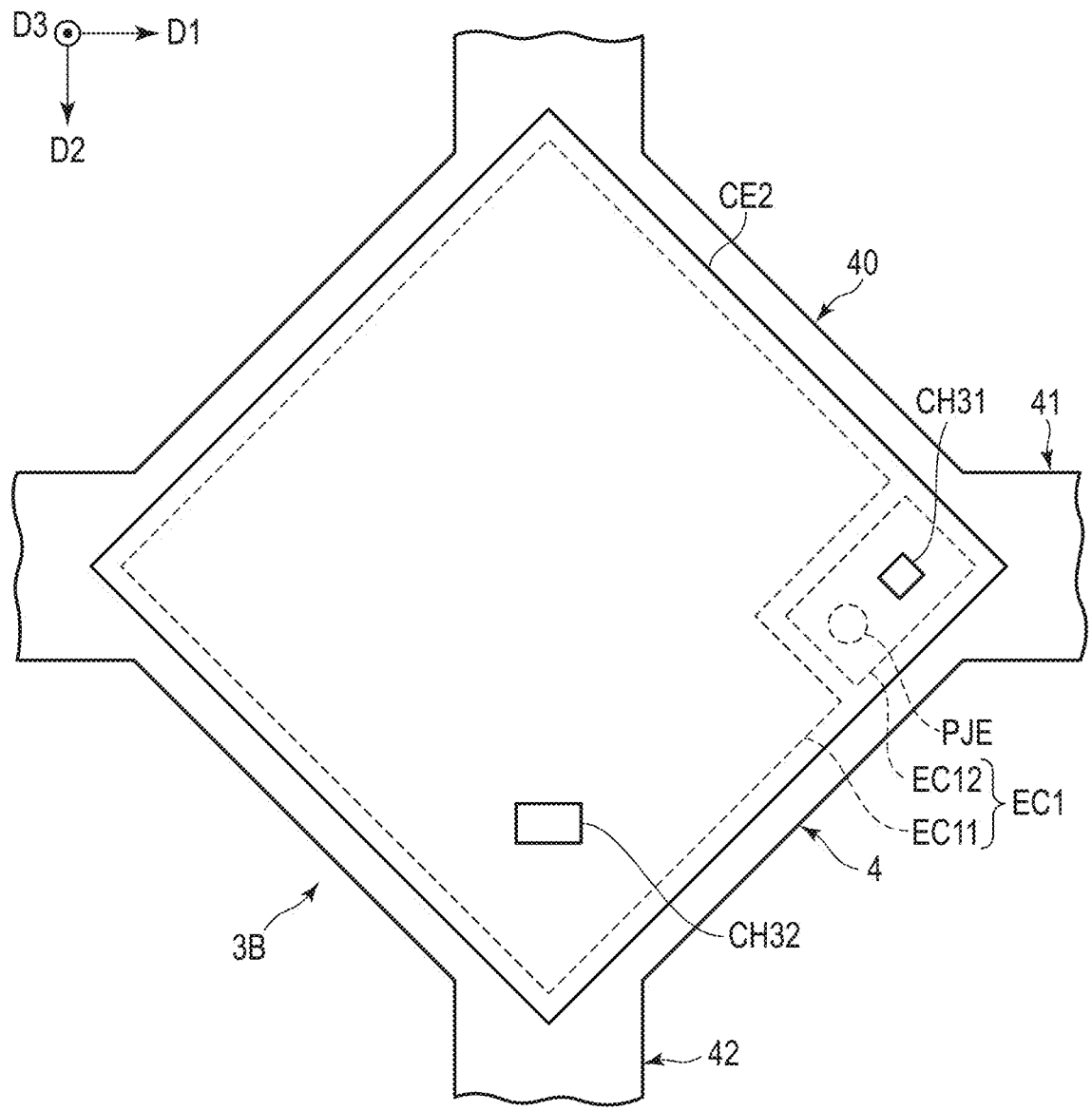
FIG. 13 is an enlarged plan view of an island-like portion shown in FIG. 12.

FIG. 13 is an enlarged plan view of the island-like portion 40 shown in FIG. 12.

As shown in FIG. 13, the flexible substrate 200 comprises a projecting portion PJE.

The first electrode EC1 includes a first portion EC11 and a second portion EC12. The first portion EC11 and the second portion EC12 are provided above the island-like portion 40. In the example illustrated, the first portion EC11 and second portion EC12 overlap the common electrode CE2 and are located on an inner side of the common electrode CE2. Note that the first portion EC11 and the second portion EC12 are electrically separated from each other. The second portion EC12 is connected to the respective power line 1E (see FIG. 12) through a contact hole CH31. The first portion EC11 is connected to the drain electrode DE, which will be described below, through a contact hole CH32. The projecting portion PJE is provided on the island-like portion 40 so as to overlap the second portion EC12.

Figure 14:
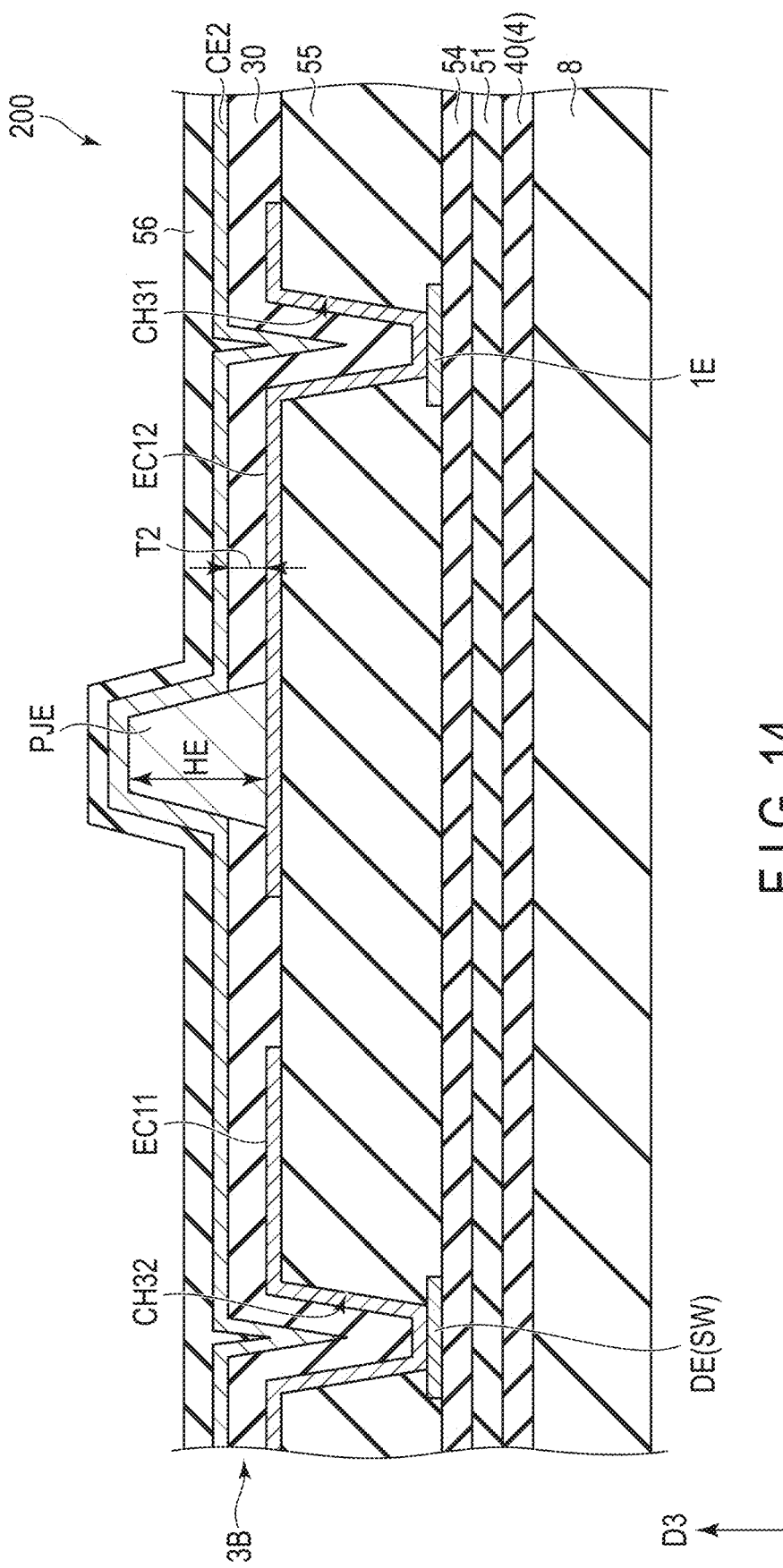
FIG. 14 is a cross-sectional view of the flexible substrate in the island-like portion shown in FIG. 13.

FIG. 14 is a cross-sectional view of the flexible substrate 200 in the island-like portion 40 shown in FIG. 13.

As shown in FIG. 14, the power line 1E is located on the insulating layer 54, and is covered by the insulating layer 55. The first portion EC11 and the second portion EC12 are each located on the insulating layer 55 and are covered by the active layer 30. The second portion EC12 is connected to the power line 1E through the contact hole CH31, which penetrates the insulating layer 55. The first portion EC11 is connected to the drain electrode DE through the contact hole CH32, which penetrates the insulating layer 55. The projecting portion PJE is located on the second portion EC12, and is in contact with each of the second portion EC12 and the common electrode CE2. The projecting portion PJE is formed of, for example, a conductive material. In other words, the projecting portion PJE is electrically connected to the second portion EC12 and the common electrode CE2 to each other. The projecting portion PJE has a thickness HE. The thickness HE is greater than the thickness T2 of the active layer 30.

Figure 15:
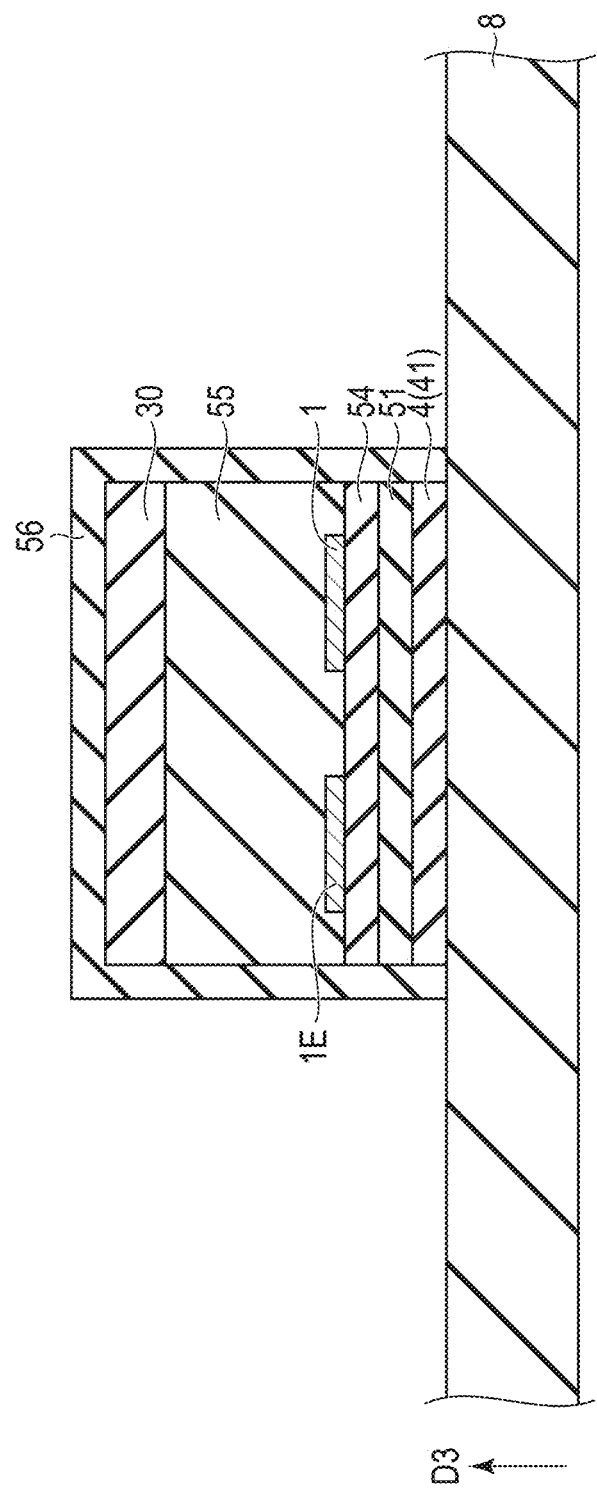
FIG. 15 is a cross-sectional view of the flexible substrate in a belt portion shown in FIG. 12.

FIG. 15 is a cross-sectional view of the flexible substrate 200 in the belt portion 41 shown in FIG. 12.

As shown in FIG. 15, the scanning lines 1 and the power lines 1E are provided in the same layer (between the insulating layer 54 and the insulating layer 55). Similarly, the signal lines 2 and the power lines 1E are provided in the same layer. The sealing layer 56 covers the active layer 30 and the insulating layer 55. In the example illustrated, the common electrode CE2 is not located between the active layer 30 and the sealing layer 56. The common electrode CE2 does not extend to the belt portion 41 and the belt portion 42.

The common electrode CE2, made of ITO or IZO, may be cracked or broken, for example, when the flexible substrate 200 is expanded, contracted or bent.

According to the second embodiment, the conductive projecting portion PJE electrically connects the common electrode CE2 and the second portion EC12 to each other, and the power line 1E, provided in the same layer as that of the scanning line 1, is connected to the second portion EC12. A plurality of common electrodes CE2 provided above a plurality of island-like portions 40, respectively, are electrically connected to each other via the power lines 1E provided above the respective belt portions 41, and a common potential is fed thereto. With this structure, the common electrode CE2 is not provided above the belt portion 41 or the belt portion 42. Thus, as compared to the case where one common electrode is provided above all of the insulating basement 4, the possibility that the common potential cannot be fed due to the common electrode being disconnected, can be lowered. Further, transparent conductive material vulnerable to bending can be used for the common electrode CE2, and therefore the choice of options in selection of the material for the common electrode CE2 is widened.

In the second embodiment, the scanning lines 1 or signal lines 2 are equivalent to the first wiring lines, the power lines 1E are equivalent to the second wiring lines, and the belt portions 41 are equivalent to the first belt portions.

Figure 16:
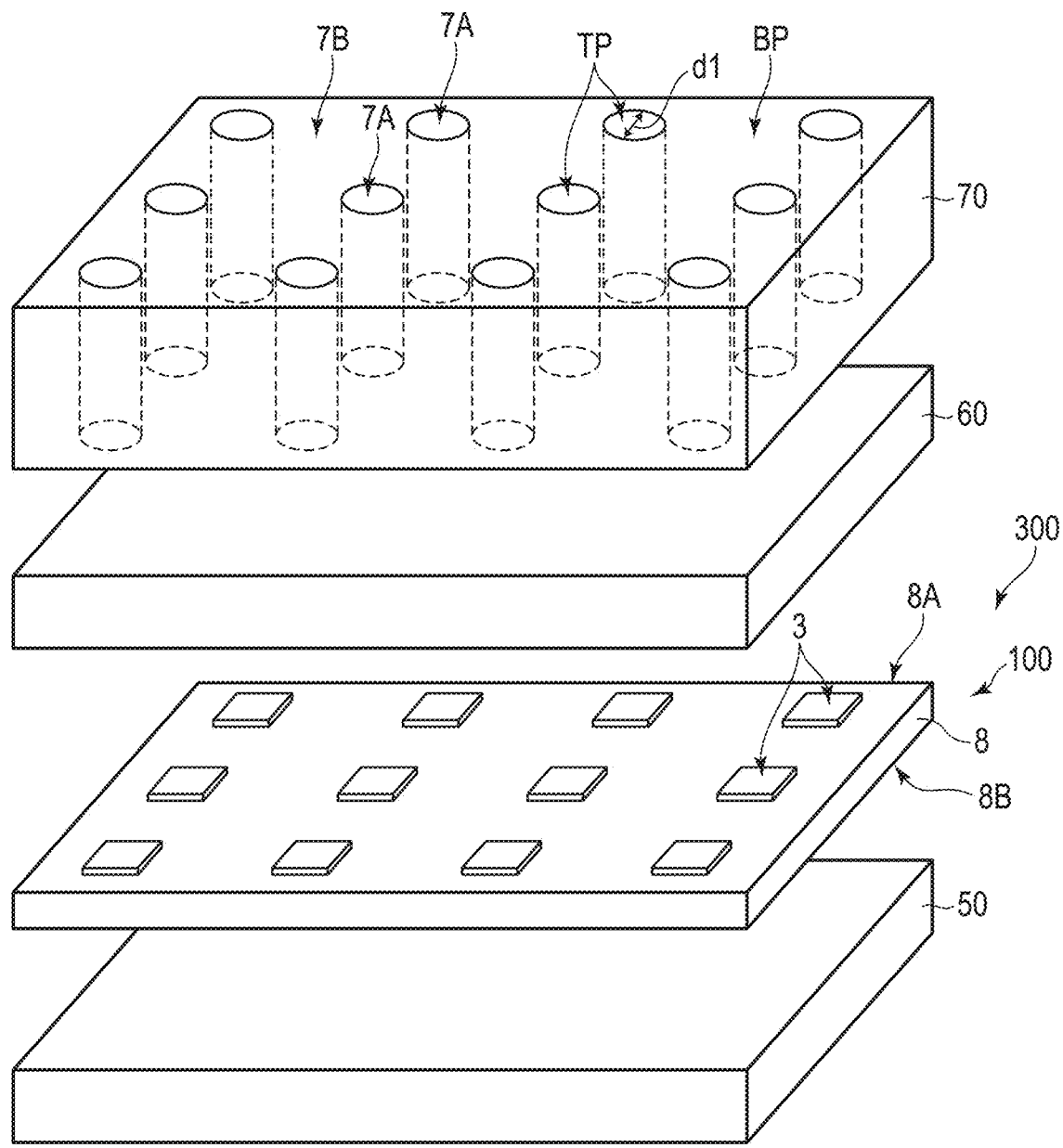
FIG. 16 is an exploded perspective view of a flexible substrate of the third embodiment.

FIG. 16 is an exploded perspective view showing a flexible substrate 300 of the third embodiment.

As shown in FIG. 16, the flexible substrate 300 comprises a flexible substrate 100 according to the first embodiment, an elastic member 50, an elastic member 60 and an optical member 70. Note that flexible substrate 100 may be the flexible substrate 100 of the modified example of the first embodiment or the flexible substrate 200 of the second embodiment.

A supporter 8 comprises a surface 8A located on a side where a plurality of electrical elements 3 are provided and opposing the elastic member 60, and a surface 8B located on an opposite side to the surface 8A and opposing the elastic member 50. The elastic member 60 is located between the support 8 and the optical member 70. The optical member 70 is, for example, a collimator, and in the example illustrated, it includes a first area 7A, a second area 7B surrounding the first area 7A, a plurality of optically transparent portions TP and a light-shielding portion BP and opposes the surface 8A. The first area 7A is a region overlapping the electrical element 3 in the direction D3, whereas the second area 7B is a region which does not overlap the electrical element 3. In the example illustrated, a plurality of first areas 7A are located in a dotted manner in the second area 7B. The optically transparent portions TP are located in the first areas 7A, respectively and the light-shielding portion BP is located in the second area 7B. The optically transparent portions TP overlap the electrical elements 3, respectively, in the direction D3. In the example illustrated, the optically transparent portions TP are each formed into a cylindrical shape, but it may be a pillar shape with a triangular, square or a multiangular cross section. The optically transparent portions TP each has a diameter dl in a D1-D2 plane, and extend in the direction D3.

The flexible substrate 300 comprises a light source (not shown), for example, a light emitting diode (LED) or an organic light emitting diode (OLED). The electrical elements 3 detect light which traveled the optically transparent portions TP in light emitted by the light source and reflected by the object to be detected. The optical member 70 transmits the light in the optically transparent portions TP and shields the light in the light-shielding portion BP, and thus it can function as pin holes to adjust the amount of light to be incident on the electrical element 3.

Figure 17:
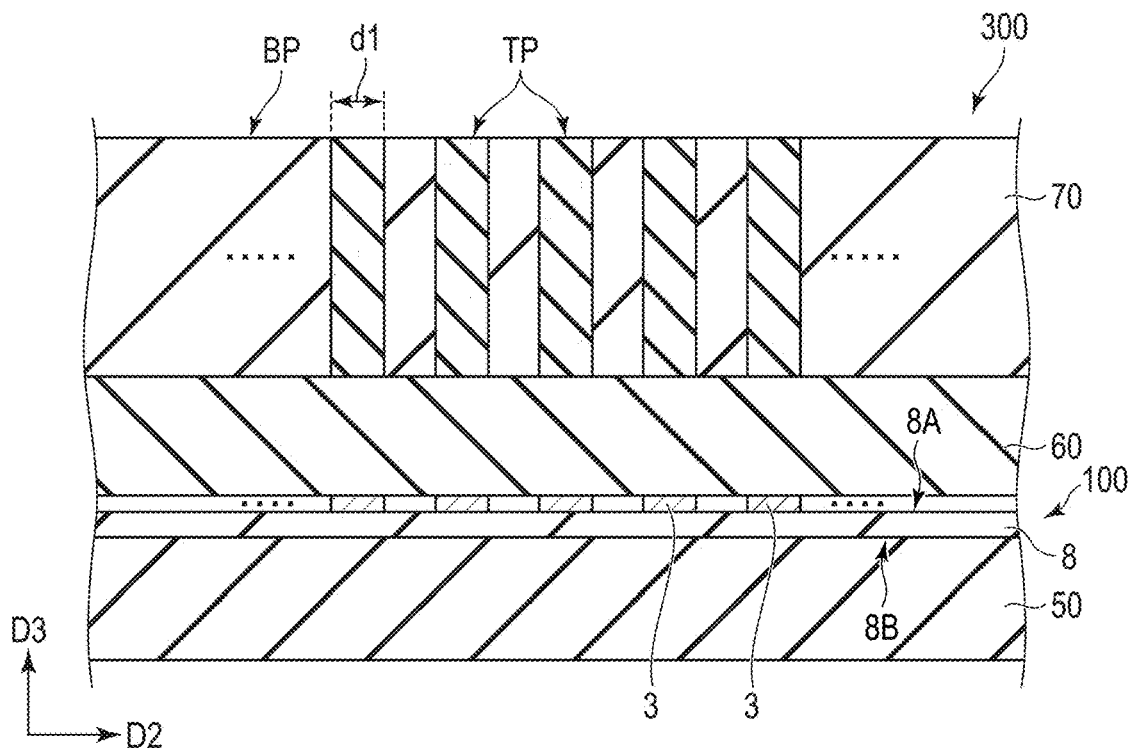
FIG. 17 is a diagram illustrating expansion and contraction of the flexible substrate shown in FIG. 16, which is a cross-sectional view of the flexible substrate while tensile stress is not being applied thereto.
Figure 18:
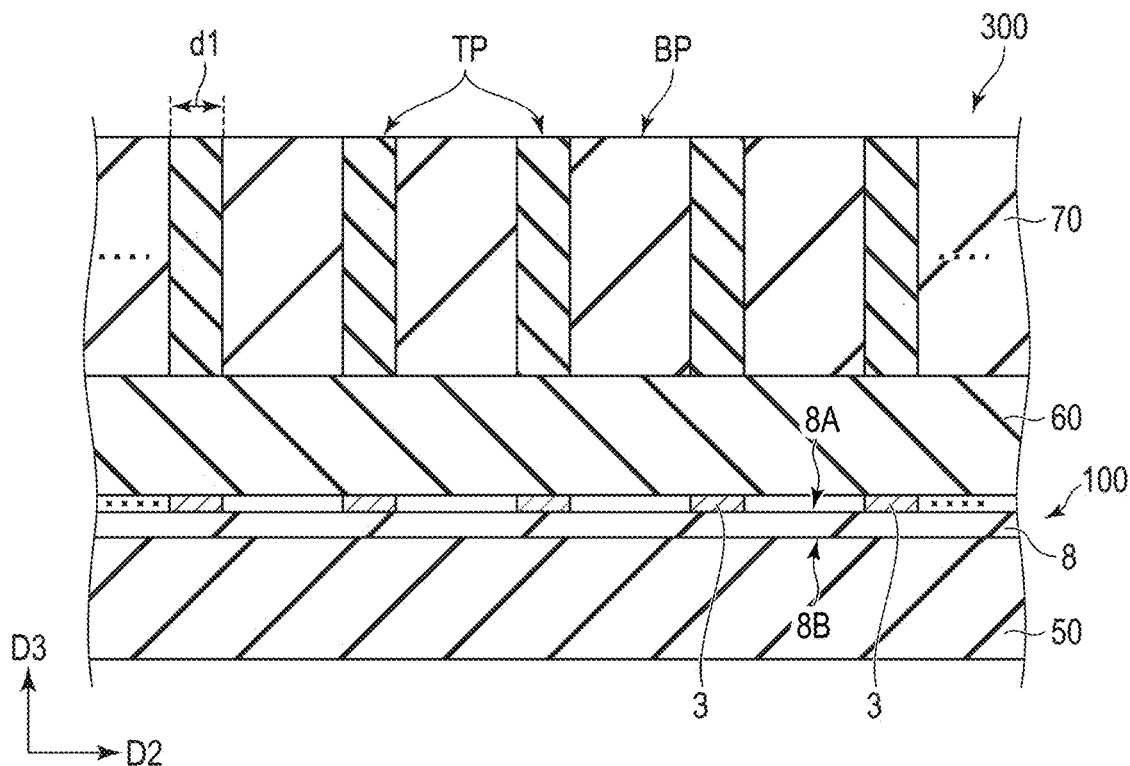
FIG. 18 is a diagram illustrating expansion and contraction of the flexible substrate shown in FIG. 16, which is a cross-sectional view of the flexible substrate while tensile stress is being applied thereto.

FIG. 17 is a diagram illustrating expansion and contraction of the flexible substrate 300, which is a cross-sectional view showing the flexible substrate while tensile stress is not being applied. FIG. 18 is a diagram illustrating expansion and contraction of the flexible substrate 300, which is a cross-sectional view showing the flexible substrate while tensile stress is being applied.

As shown in FIG. 17, the elastic members 50 and 60 are each adhered to the flexible substrate 100. The elastic members 50 and 60 are formed of, for example, an elastic resin. For example, each of an elastic modulus of the elastic member 50 and an elastic modulus of the elastic member 60 is lower than an elastic modulus of the flexible substrate 100. The optically transparent portion TP of the flexible substrate 100 is formed of a transparent resin and has an elastic modulus EM1. The light-shielding portion BP is formed of a light-absorbing member and is, for example, black in color. The light-shielding portion BP has an elastic modulus EM2, which lower than the elastic modulus EM1. Note that the elastic modulus EM1 should preferably be ten times or more the elastic modulus EM2.

FIG. 18 is a cross-sectional view of the flexible substrate 300 when, for example, tensile stress is applied to the flexible substrate 300 in the direction D2. The flexible substrate 100, the elastic member 50, the elastic member 60 and the optical member 70 are each expanded in the direction D2.

Next, let us focus on the optical member 70. Here, the elastic modulus of the light-shielding portion BP is lower than that of the optically transparent portions TP, and the light-shielding portion BP is more deformable than the optically transparent portions TP. With this configuration, the light-shielding portion BP located between adjacent optically transparent portions TP expands and each optically transparent portion TP itself does not deform. Further, as the light-shielding portion BP expands, the optically transparent portions TP can support the change in position of the electrical elements 3. In the flexible substrate 300 deformed as a tensile stress is applied, each optically transparent portion TP does not deform and overlaps the electrical elements 3 in the direction D3. Thus, the optical member 70 can inhibit light condensation undesired for the electrical elements 3, which may be caused in the flexible substrate 300 while, for example, tensile stress being applied thereto, the optically transparent portions TP deform and the optically transparent portions TP are misaligned with respect to the respective electrical elements 3.

As discussed above, according to this embodiment, a flexible substrate which can improve the product reliability can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A flexible substrate comprising:
an insulating basement including an island-like portion and a plurality of belt portions formed to be integrated with the island-like portion;
an organic insulating layer provided on the insulating basement; and
an electrical element and a projecting portion, provided on the organic insulating layer and overlapping the island-like portion,
the electrical element comprising a common electrode, a first electrode located between the organic insulating layer and the common electrode, and an active layer located between the common electrode and the first electrode,
the projecting portion being located on the first electrode and projecting in a direction towards the common electrode from the first electrode,
the projecting portion being placed at a center of the first electrode in plan view.

2. The flexible substrate of claim 1, wherein
the projecting portion is located between the active layer and the first electrode and has a first thickness in the direction in which the projecting portion projects, and
the active layer has a thickness less than the first thickness.

3. The flexible substrate of claim 2, wherein
at least two projecting portions each identical to the projecting portion are formed, and
the at least two projecting portions are arranged to be vertically and horizontally symmetrical with respect to the center of the first electrode in plan view.

4. The flexible substrate of claim 2, further comprising
an optical member comprising an optically transparent portion overlapping the electrical element, and a light-shielding portion surrounding the optically transparent portion without overlapping the electrical element,
wherein
the optically transparent portion has a first elastic modulus, and
the light-shielding portion has a second elastic modulus less than the first elastic modulus.

5. The flexible substrate of claim 1, wherein
at least two projecting portions each identical to the projecting portion are formed, and
the at least two projecting portions are arranged to be vertically and horizontally symmetrical with respect to the center of the first electrode in plan view.

6. The flexible substrate of claim 5, further comprising
an optical member comprising an optically transparent portion overlapping the electrical element, and a light-shielding portion surrounding the optically transparent portion without overlapping the electrical element,
wherein
the optically transparent portion has a first elastic modulus, and
the light-shielding portion has a second elastic modulus less than the first elastic modulus.

7. The flexible substrate of claim 1, further comprising
a switching element located in the island-like portion and formed between the insulating basement and the organic insulating layer,
wherein
the first electrode is connected to the switching element.

8. The flexible substrate of claim 7, further comprising:
a first wiring line; and
a second wiring line,
wherein
the plurality of belt portions include a first belt portion extending in a first direction,
the first electrode includes a first portion and a second portion electrically separated from the first portion,
the first wiring line and the second wiring line are provided on the first belt portion,
the first wiring line is connected to the first portion via the switching element, and
the second wiring line is connected to the second portion.

9. The flexible substrate of claim 8, wherein
the projecting portion is formed of a conductive material, and is in contact with each of the second portion and the common electrode.

10. The flexible substrate of claim 7, further comprising
an optical member comprising an optically transparent portion overlapping the electrical element, and a light-shielding portion surrounding the optically transparent portion without overlapping the electrical element,
wherein
the optically transparent portion has a first elastic modulus, and
the light-shielding portion has a second elastic modulus less than the first elastic modulus.

11. The flexible substrate of claim 1, further comprising
an optical member comprising an optically transparent portion overlapping the electrical element, and a light-shielding portion surrounding the optically transparent portion without overlapping the electrical element,
wherein
the optically transparent portion has a first elastic modulus, and
the light-shielding portion has a second elastic modulus less than the first elastic modulus.

12. The flexible substrate of claim 11, wherein
the light-shielding portion is black in color.

* * * * *